United States Patent
Basker et al.

(10) Patent No.: US 9,524,882 B2
(45) Date of Patent: Dec. 20, 2016

(54) CONTACT STRUCTURE AND EXTENSION FORMATION FOR III-V NFET

(71) Applicant: International Business Machines Corporation, Armonk, NY (US)

(72) Inventors: Veeraraghavan S. Basker, Schenectady, NY (US); Alexander Reznicek, Troy, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/930,258

(22) Filed: Nov. 2, 2015

(65) Prior Publication Data
US 2016/0343585 A1 Nov. 24, 2016

Related U.S. Application Data

(63) Continuation of application No. 14/718,425, filed on May 21, 2015.

(51) Int. Cl.
*H01L 21/20* (2006.01)
*H01L 29/66* (2006.01)
(Continued)

(52) U.S. Cl.
CPC ..... *H01L 21/3228* (2013.01); *H01L 21/02381* (2013.01); *H01L 21/02546* (2013.01); *H01L 21/02667* (2013.01); *H01L 21/02694* (2013.01); *H01L 21/823814* (2013.01); *H01L 21/845* (2013.01); *H01L 27/0886* (2013.01); *H01L 27/1211* (2013.01); *H01L 29/267* (2013.01);
(Continued)

(58) Field of Classification Search
CPC ............ H01L 29/785; H01L 29/66795; H01L 27/1211; H01L 27/0924; H01L 21/845; H01L 21/823821; H01L 21/02387–21/02398; H01L 21/02538–21/02549; H01L 21/20–21/207; H01L 29/267; H01L 29/7848; H01L 29/66636; H01L 27/0886; H01L 21/823814; H01L 21/0238
See application file for complete search history.

(56) References Cited

U.S. PATENT DOCUMENTS 5,019,529 A 5/1991 Takasaki
7,128,786 B2 10/2006 Jurgensen
(Continued)

OTHER PUBLICATIONS

Veeraraghavan S. Basker et al. Contact Structure and Extension Formation for III-V NFET, unpublished U.S. Appl. No. 14/718,425, filed May 21, 2015, pp. 1-15 plus 8 sheets drawings.
(Continued)

*Primary Examiner* — Marvin Payen
*Assistant Examiner* — Jeremy Joy
(74) *Attorney, Agent, or Firm* — Daniel P. Morris; Otterstedt, Ellenbogen & Kammer, LLP

(57) ABSTRACT

FinFET devices including III-V fin structures and silicon-based source/drain regions are formed on a semiconductor substrate. Silicon is diffused into the III-V fin structures to form n-type junctions. Leakage through the substrate is addressed by forming p-n junctions adjoining the source/drain regions and isolating the III-V fin structures under the channel regions.

14 Claims, 8 Drawing Sheets

(51) Int. Cl.
*H01L 29/78* (2006.01)
*H01L 21/322* (2006.01)
*H01L 21/02* (2006.01)
*H01L 21/84* (2006.01)
*H01L 29/267* (2006.01)
*H01L 27/088* (2006.01)
*H01L 21/8238* (2006.01)
*H01L 27/12* (2006.01)

(52) U.S. Cl.
CPC ... *H01L 29/66522* (2013.01); *H01L 29/66636* (2013.01); *H01L 29/66795* (2013.01); *H01L 29/785* (2013.01); *H01L 29/7848* (2013.01)

(56) References Cited

U.S. PATENT DOCUMENTS

| | | | |
|---|---|---|---|
| 8,242,540 B2 | 8/2012 | Wann | |
| 8,338,259 B2* | 12/2012 | Wu | H01L 29/165 257/288 |
| 8,481,410 B1 | 7/2013 | Licausi | |
| 8,603,898 B2 | 12/2013 | Bao | |
| 8,759,169 B2 | 6/2014 | Kittler | |
| 8,785,285 B2* | 7/2014 | Tsai | H01L 29/66795 257/E21.409 |
| 8,823,146 B1 | 9/2014 | Hoke | |
| 2014/0110755 A1* | 4/2014 | Colinge | H01L 29/41791 257/192 |
| 2014/0167163 A1* | 6/2014 | Cheng | H01L 29/785 257/347 |
| 2014/0264488 A1* | 9/2014 | Fronheiser | H01L 29/66795 257/288 |
| 2014/0377918 A1* | 12/2014 | Cheng | H01L 29/785 438/163 |
| 2015/0132909 A1* | 5/2015 | Choi | H01L 29/66803 438/283 |
| 2015/0255545 A1* | 9/2015 | Holland | H01L 29/66795 257/288 |
| 2015/0255570 A1* | 9/2015 | Basu | H01L 29/6681 257/352 |
| 2015/0255606 A1* | 9/2015 | Cheng | H01L 29/7848 257/192 |
| 2015/0380258 A1* | 12/2015 | Liu | H01L 21/3086 257/192 |
| 2016/0020305 A1* | 1/2016 | Obradovic | H01L 29/7391 257/39 |
| 2016/0064526 A1* | 3/2016 | Jacob | H01L 29/66795 438/492 |

OTHER PUBLICATIONS

List of IBM Patents or Applications Treated as Related.

* cited by examiner

CONTACT STRUCTURE AND EXTENSION FORMATION FOR III-V NFET

CROSS-REFERENCE TO RELATED APPLICATION

This application is a continuation of U.S. patent application Ser. No. 14/718,425 filed May 21, 2015, the complete disclosure of which is expressly incorporated herein by reference in its entirety for all purposes.

FIELD

The present disclosure relates generally to semiconductor devices and fabrication methods, and more specifically, to III-V nFET structures and methods of fabrication thereof.

BACKGROUND

III-V compounds offer a number of advantages over silicon with respect to the operation of semiconductor devices such as field-effect transistors. The heterointegration of III-V compounds on materials such as silicon allows the co-integration of III-V nFETs with SiGe pFETs. III-V and CMOS is one possible option for sub-10 nm technology nodes.

Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). III-V FinFETs fabricated on silicon wafers offer performance advantages over devices based entirely on silicon.

The lattice mismatch between silicon and many III-V semiconductor materials needs to be addressed when combining such materials in an electronic device. Aspect ratio trapping (ART) is an effective technique to trap threading dislocations, thereby reducing the dislocation density of lattice mismatched materials grown on silicon.

SUMMARY

Principles of the present disclosure provide techniques for junction formation by diffusion in the fabrication of FinFET devices including fins comprising III-V materials.

An exemplary method includes obtaining a semiconductor structure including a semiconductor substrate and a plurality of columns extending from the semiconductor substrate. The columns are separated by a plurality of recesses. Each of the columns includes a III-V base and a III-V fin structure, the III-V fin structure being positioned on the III-V base. A silicon-containing layer is grown epitaxially on the semiconductor substrate and within the recesses such that a portion of the silicon-containing layer adjoins the III-V fin structures. The method further includes causing diffusion of silicon from the silicon-containing layer into the III-V fin structures to form n-type junctions and forming n-type source/drain regions from the silicon-containing layer.

An exemplary structure includes a semiconductor substrate and a plurality of columns extending from the semiconductor substrate. The columns are separated by a plurality of recesses. Each of the columns includes a III-V base and a III-V fin structure, the III-V fin structure comprising arsenic and being positioned on the III-V base. A silicon-containing layer adjoins the semiconductor substrate. The silicon-containing layer comprises a plurality of n-type source/drain regions. A plurality of n-type junctions adjoin the source/drain regions. Each of the n-type junctions includes silicon diffused within the III-V fin structures and arsenic diffused within the source/drain regions.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided. For example, one or more embodiments may provide one or more of the following advantages:
  High performance nFETs with III-V fin channels;
  Facilitate junction formation using diffusion of silicon and a group V element;
  Enables source and drain contact formation on silicon-based semiconductor material using known, proven techniques;
  Reduction or elimination of potential leakage through the substrate.

These and other features and advantages of the present disclosure will become apparent from the following detailed description of illustrative embodiments thereof, which is to be read in connection with the accompanying drawings.

BRIEF DESCRIPTION OF THE DRAWINGS

The following detailed description, given by way of example, will best be appreciated in conjunction with the accompanying drawings, which are not necessarily to scale, and wherein like reference numerals denote like elements and parts, in which.

DETAILED DESCRIPTION

In accordance with the embodiments disclosed herein, nFETs are obtained that include III-V channels, silicon-based source/drain regions, and junctions between the source/drain regions and III-V channels including diffused silicon.

Figure 1A:
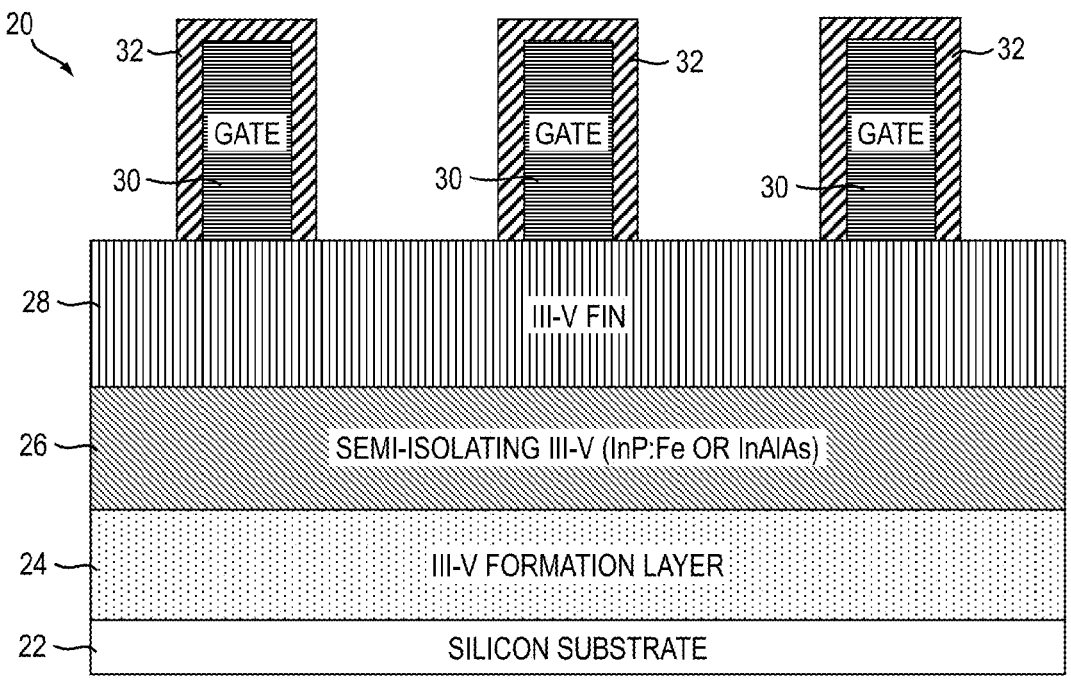
FIG. 1A is a schematic, sectional illustration of a structure including III-V semiconductor fins taken along the section line provided in FIG. 1B.
Figure 1B:
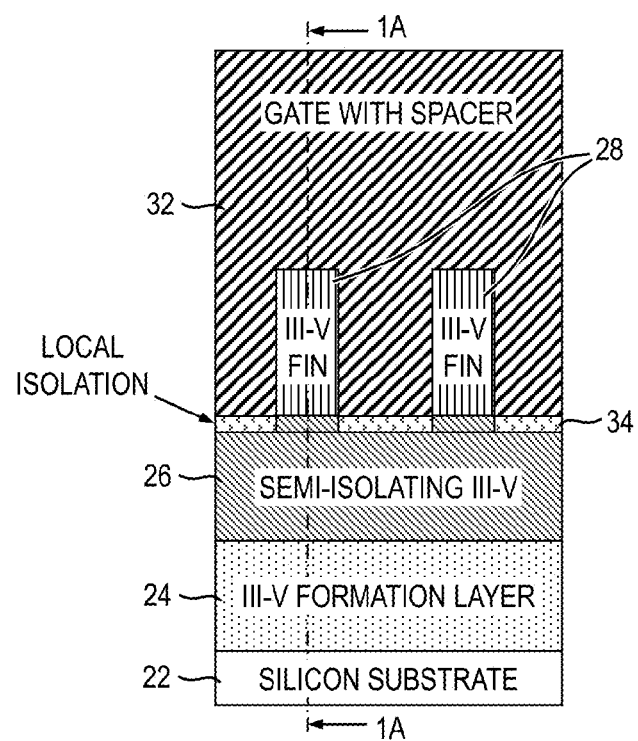
FIG. 1B is a further sectional view of the structure shown in FIG. 1A.

Referring to FIGS. 1A and 1B, a partially completed semiconductor structure 20 includes a crystalline semiconductor substrate 22. A bulk silicon wafer is employed as the substrate in some embodiments. The substrate consists essentially of mono-crystalline silicon in one or more embodiments. Depending upon intended applications, other semiconductor substrates may alternatively be employed such as germanium substrates, silicon-on-insulator substrates, germanium-on-insulator (GeOI) substrates and SGOI (SiGe on insulator) substrates. As discussed further below, the semiconductor substrate 22 has a surface portion that allows the subsequent epitaxial growth of silicon-containing materials thereon without the difficulties and problems associated with growing such material on substrates where a significant lattice mismatch would be present. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminium, gallium and indium. As used herein, "n-type" refers to the addition of impurities that contributes free electrons to an intrinsic semiconductor. In a silicon-containing substrate, examples of n-type dopants, i.e., impurities, include but are not limited to antimony, arsenic and phosphorous. Silicon is an n-type dopant in III-V semiconductor materials. Single crystal silicon wafers are commercially available and are characterized by a diamond cube lattice structure. As known in the art, the Miller indices of a substrate are determined from the reciprocals of the points at which the crystal plane of silicon intersects the principle crystalline axes. While some exemplary embodiments relate to structures including doped or undoped (100) silicon as a substrate material, it will be appreciated that the principles expressed are applicable to other semiconductor substrates and substrates with crystallographic orientations other than (100) on which III-V semiconductor materials can be epitaxially grown, including off-axis silicon substrates.

A blanket layer 24 of III-V semiconductor material is epitaxially grown directly on the top surface of the substrate 22. The blanket layer 24 can include one or more layers, with different III-V semiconductor materials grown on each other. The blanket layer is a graded III-V buffer layer in some embodiments. The blanket layer provides a lattice matched template for aspect ratio trapping in some embodiments. Exemplary III-V semiconductor materials include but are not limited to gallium arsenide (GaAs), indium phosphide (InP) and indium gallium arsenide (InGaAs). These exemplary III-V materials are grown in order on the substrate 20 in some embodiments, forming the blanket layer 24. As known in the art, indium phosphide and indium gallium arsenide have larger lattice constants than gallium arsenide. The lattice constants of $In_{0.53}Ga_{0.47}As$ and InP are the same, allowing a high quality InGaAs layer to be grown on InP. The surface of the substrate 22 is cleaned if required to remove materials such as oxides that may be present prior to growth of the III-V layer thereon. Various processes are familiar to those of skill in the art for growing III-V semiconductor materials on silicon substrates. Such processes include metalorganic chemical vapor deposition (MOCVD) and molecular beam epitaxy (MBE). Many different III-V compounds could be grown on the substrate 22 and accordingly multiple precursors could be used. Depending on which III-V material(s) is to be grown and which precursor is used, different parameters (temperature, process pressure, times, etc.) are applicable. Metalorganic precursors include Trimethylgallium, Trimethylaluminum, Trimethylindium, Trimethylantimony, Tertiarybutylarsine and Tertiarybutylphosphine. Alternate Group V precursors include arsine and phosphine. Depending which Group V source is used, process temperature, gas flow, pressure and times vary significantly. The process parameters for growing III-V semiconductor materials on silicon and on other III-V semiconductor materials are well known in the art and new methods continue to be developed. The deposited III-V layer 24 that directly contacts the top surface 22 of the substrate 20 may include misfit defects near the interface with the top surface of the substrate 20 and threading dislocations that propagate towards the surface of the III-V layer. Dislocation density of the layer 24 is in the range of $10^6$-$10^9$ $cm^{-2}$ in some embodiments. In one or more embodiments, the layer 24 has a thickness between 500 nm and 5 μm. As discussed above, the layer 24 may in fact consist of multiple III-V semiconductor layers, in which case the bottom III-V semiconductor layer that directly contacts the top surface of the substrate 22 would include misfit defects caused by the lattice mismatch with the substrate 22 while the threading dislocations extend within the succeeding III-V semiconductor layer(s).

A semi-isolating III-V layer 26 is grown on the blanket layer 24 in some embodiments. Exemplary materials for this layer include InP:Fe and $In_{1-x}Al_xAs$. The thickness of the semi-isolating III-V layer 26 is between one hundred nanometers (100 nm) to one (1) micrometer in some embodiments. Fin structures 28 are formed on the semi-isolating III-V layer 26 in embodiments that include such a layer. The fin structures 28 are formed by growing a blanket III-V layer such as InGaAs onto the semi-isolating layer 26 and then removing selected portions of the blanket layer to obtain the fin structures. An exemplary fin formation method employed in one or more embodiments includes sidewall image transfer, Lithographic techniques may alternatively be employed. As InAlAs has substantially the same lattice constant as $In_{0.53}Ga_{0.47}As$, these two III-V materials are employed for forming the semi-isolating layer 26 and the fin structures 28 in some embodiments.

Gate structures 30 and dielectric spacers 32 are formed on the III-V fin structures. The gate structures can be dummy gates in some embodiments. Any suitable deposition technique can be used to deposit high-k and metal gate materials, including but not limited to atomic layer deposition, chemical vapor deposition, physical vapor deposition, sputtering, and plating. The dielectric spacers 32 are formed around the gate structures 30. Plasma enhanced chemical vapor deposition (PECVD) is a known process for depositing silicon nitride layers and can be used for depositing the spacer material on the gate structures.

As shown in FIG. 1B, the gate structures 30 adjoin the semi-isolating layer 26. An electrically insulating layer 34 on the semi-insulating layer is provided between the fin structures 28. The electrically insulating layer provides local isolation of the fin structures 28.

Figure 2A:
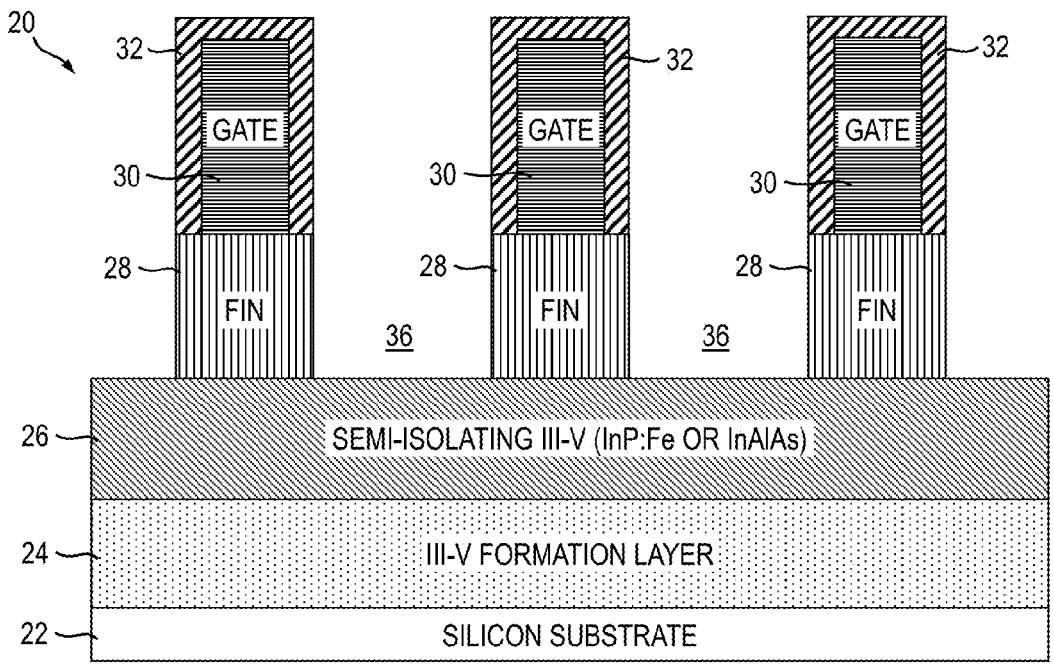
FIG. 2A is a schematic, sectional illustration taken along the section line provided in FIG. 2B showing recesses formed in the III-V semiconductor fins.
Figure 2B:
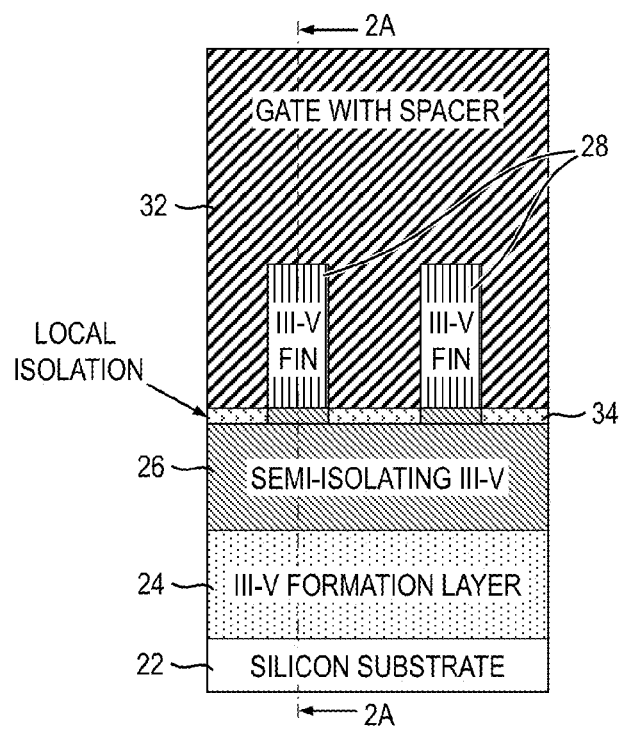
FIG. 2B is a further sectional view of the structure shown in FIG. 2A.
Figure 3A:
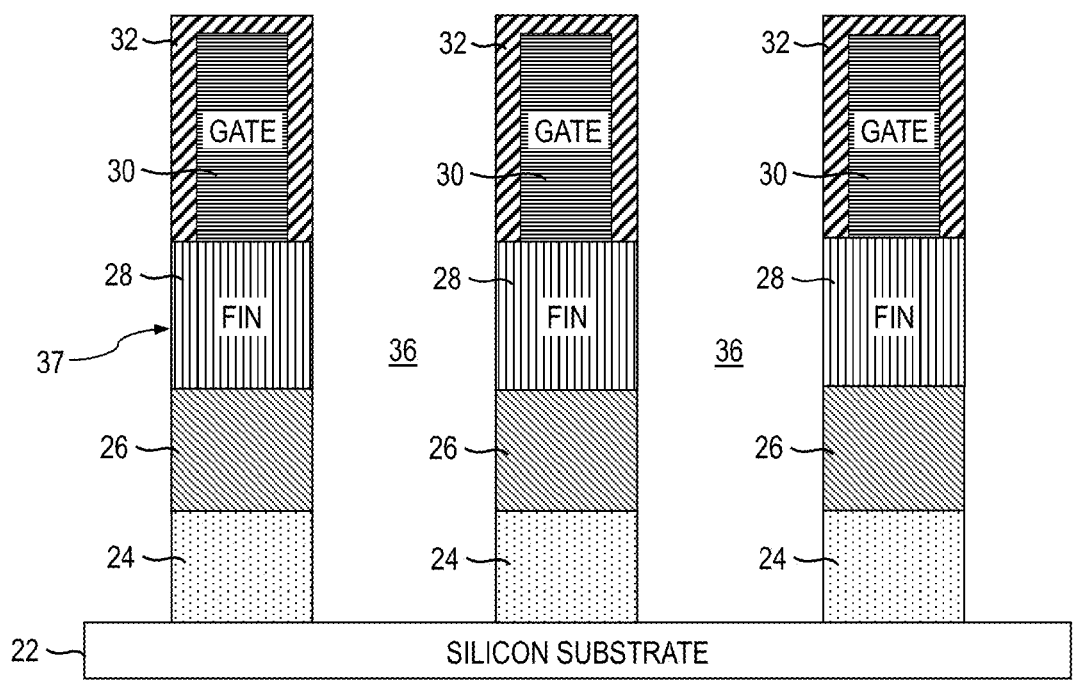
FIG. 3A is a schematic, sectional illustration taken along the section line provided in FIG. 3B showing the structure of FIG. 2A following recessing of the layer of III-V semiconductor layers down to a silicon substrate layer.

Referring to FIG. 2A, recesses 36 are formed in the III-V fin structures 28 down to the semi-isolating layer 26. Directional reactive ion etching may be employed to remove portions of the III-V fin structures 28 in the source/drain regions. The spacers 32 function as a hard mask during this process. The etch is selective to the III-V material(s) comprising the fin structures in some embodiments The recesses 36 are extended down to the silicon substrate 22, as shown in FIG. 3A. The formation of the recesses in the fin structures 28 and extension of the recesses is conducted as a single, continuous step by directional reactive ion etching in one or more embodiments. A plurality of columns 37 are obtained, each column including a III-V fin structure 28 supported by a III-V base including a portion of the blanket layer 24 and a portion of the semi-isolating layer 26. As discussed above, the III-V base includes only the blanket layer 24 in some embodiments.

Figure 4A:
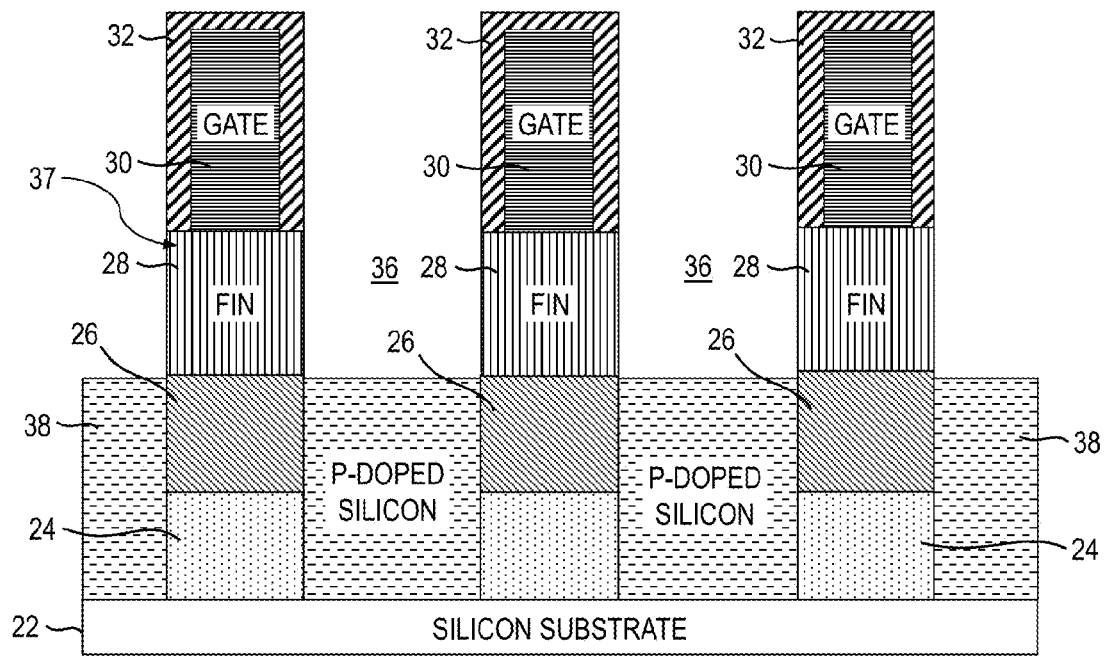
FIG. 4A is a schematic, sectional illustration taken along the section line provided in FIG. 4B showing the structure of FIG. 3A following the epitaxial growth of p-type silicon on the silicon substrate layer.
Figure 4B:
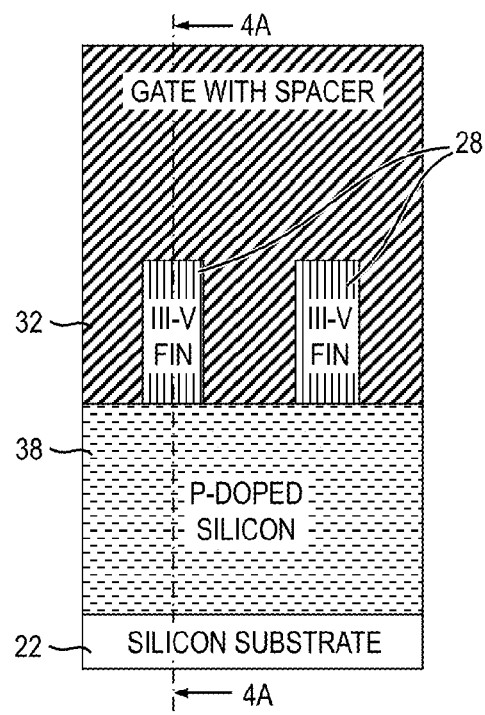
FIG. 4B is a sectional view of the structure shown in FIG. 4A.
Figure 5A:
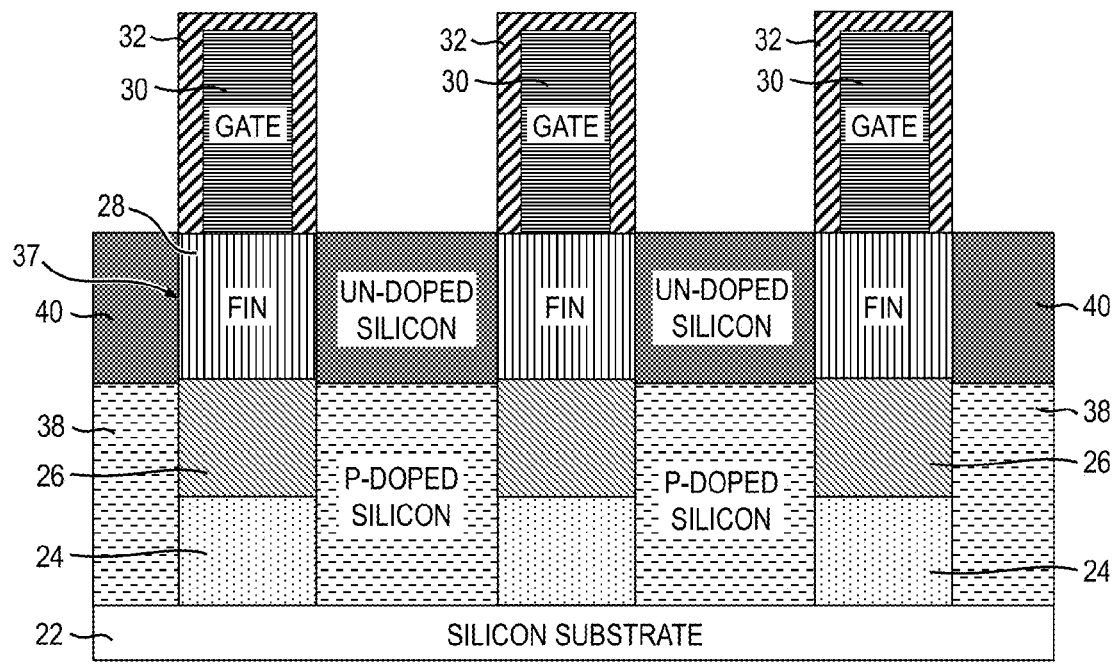
FIG. 5A is a schematic, sectional illustration taken along the section line provided in FIG. 5B showing the structure of FIG. 4A following epitaxial growth of an undoped silicon layer on the p-type silicon portions thereof.
Figure 5B:
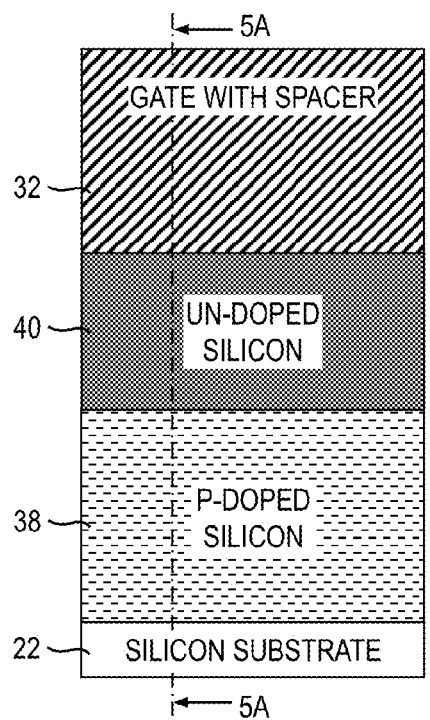
FIG. 5B is a sectional view of the structure shown in FIG. 5A.

A p-type silicon layer 38 is grown epitaxially on the exposed surfaces of the silicon substrate in some embodiments to obtain the structure shown in FIGS. 4A and 4B. The top surface of the p-type silicon layer is beneath the bottom surfaces of the fin structures. Due to lattice mismatch, growth of the p-type silicon layer directly on the III-V blanket layer is impractical. During the same epitaxial deposition process, the dopant is removed from the source gas (e.g. silane) and an undoped silicon layer 40 is grown in the recesses 36 between the fin structures. The undoped silicon layer extends to the top surfaces of the fin structures or slightly above such surfaces. FIGS. 5A and 5B show an exemplary structure 50 obtained following growth of the silicon layers 38, 40. In some embodiments, an undoped silicon layer is epitaxially grown on the silicon substrate 22 and extends to the top surfaces of the III-V fin structures 28. In such embodiments, a p-type silicon layer is not employed.

Figure 6A:
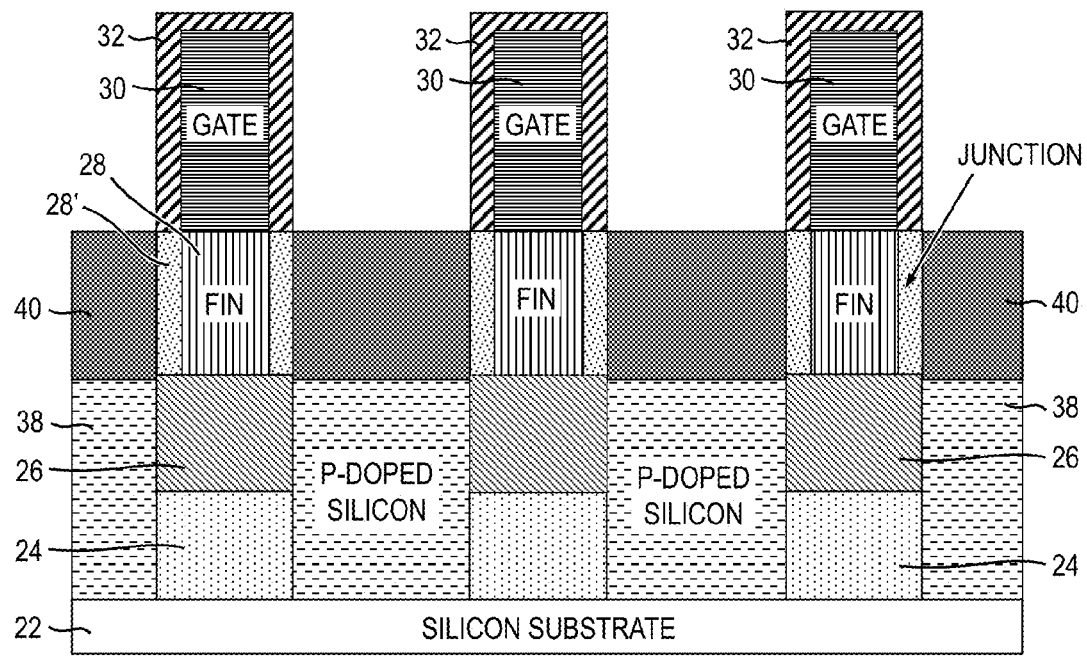
FIG. 6A is a schematic, sectional illustration taken along the section line provide in FIG. 6B showing the structure of FIG. 5A following annealing to form junctions within the III-V fins.
Figure 6B:
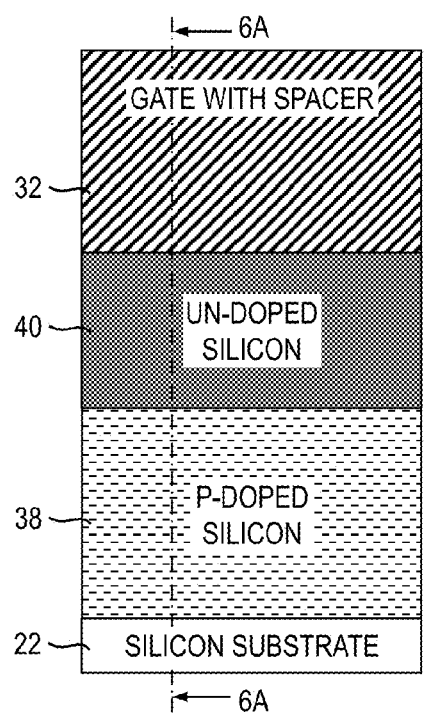
FIG. 6B is a sectional view of the structure shown in FIG. 6A

The structure 50 obtained following epitaxial silicon deposition is subjected to annealing to form junctions 28' on the fin structures, as shown in FIG. 6A. Silicon, which is an n-type dopant in III-V semiconductor materials, diffuses into the III-V fin structures 28. Arsenic contained in fin structure materials such as InGaAs or GaAs will diffuse into the undoped silicon layer 40 and form n-type material therein. The anneal process used in forming the junctions may be a rapid thermal anneal, furnace annealing, flash annealing, laser annealing or any suitable combination of those techniques. The annealing temperature may range from 600° to 1300° C. with an anneal time ranging from a millisecond to 30 minutes. In one embodiment, the annealing is done by a flash anneal process at about 1200° C. for twenty (20) milliseconds.

Figure 7A:
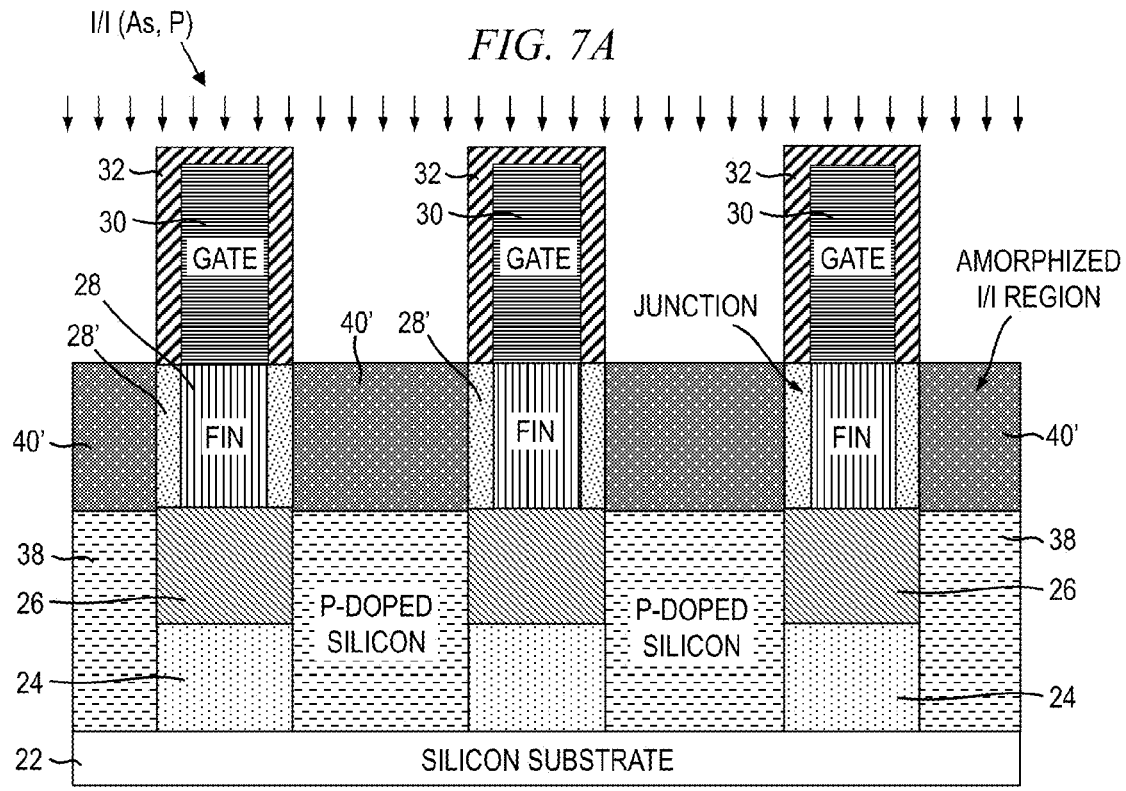
FIG. 7A is a schematic, sectional illustration taken along the section line provided in FIG. 7B showing the structure of FIG. 6A following ion implantation to form source/drain regions adjoining the junctions.
Figure 7B:
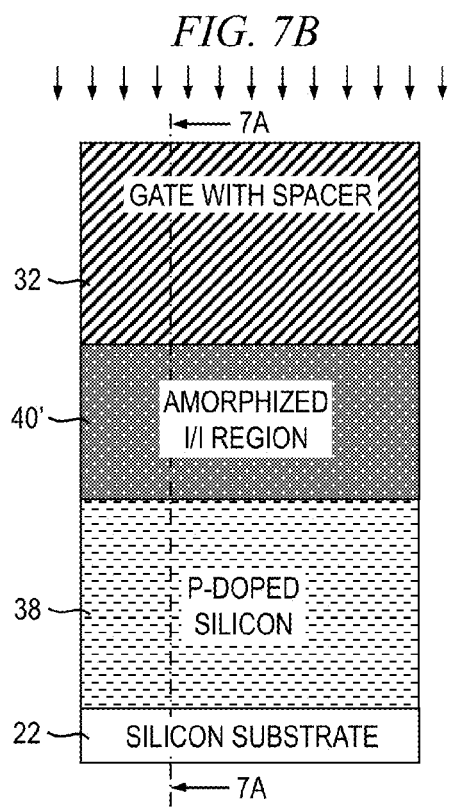
FIG. 7B is a sectional view of the structure shown in FIG. 7A.

Ion implantation of the undoped silicon layer 40, which now contains diffused arsenic in the regions adjoining the III-V fin structures as described above, is performed to obtain doping levels suitable for obtaining source/drain regions. As discussed above, arsenic and phosphorus are n-type dopants that can be used to form ion implanted regions 40' that adjoin the junctions 28' as shown in FIG. 7A. Ion implantation (I/I) is schematically indicated by arrows in FIGS. 7A and 7B, and results in the formation of the amorphized I/I regions 40' shown in the figures.

Figure 8A:
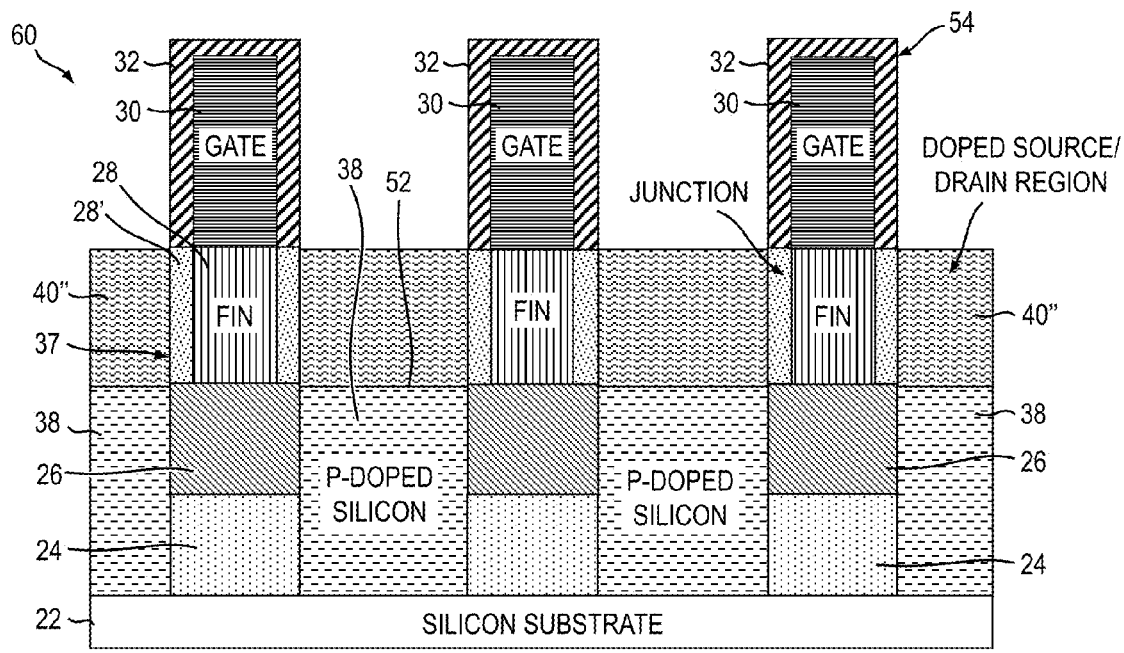
FIG. 8A is a schematic, sectional illustration taken along the section line provided in FIG. 8B showing the structure of FIG. 7A following a second anneal to recrystallize the ion implanted source/drain regions.
Figure 8B:
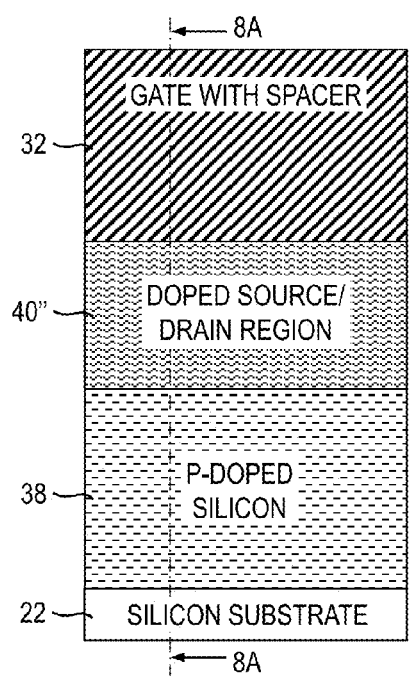
FIG. 8B is a sectional view of the structure shown in FIG. 8A.

Damage to the crystalline structure of the undoped silicon layer 40 following ion implantation is addressed by a second annealing process wherein the ion implanted regions 40' are recrystallized. The second annealing process is conducted in a temperature range between 600 to 1000 C.° for one to ten minutes. Doped source/drain regions 40" as shown in FIG. 8A are thereby obtained. The resulting structure 60 includes pn junctions 52 in the silicon-containing source/drain regions 40" of the n-type FinFET transistors 54 obtained that reduce or eliminate leakage through the silicon substrate 22. The isolating III-V structure beneath the channel regions of the transistors 54 further contributes to the elimination of leakage. The high mobility of the III-V material comprising the fins of the nFET transistors 54 allows high performance compared to devices based entirely on silicon. Source and drain contact formation (not shown) on the doped source/drain regions 40" can be effected using conventional techniques as the source/drain regions comprise silicon. Back-end-of-line processing can be conducted once the structure 60 shown in FIGS. 8A and 8B is obtained.

Figure 3B:
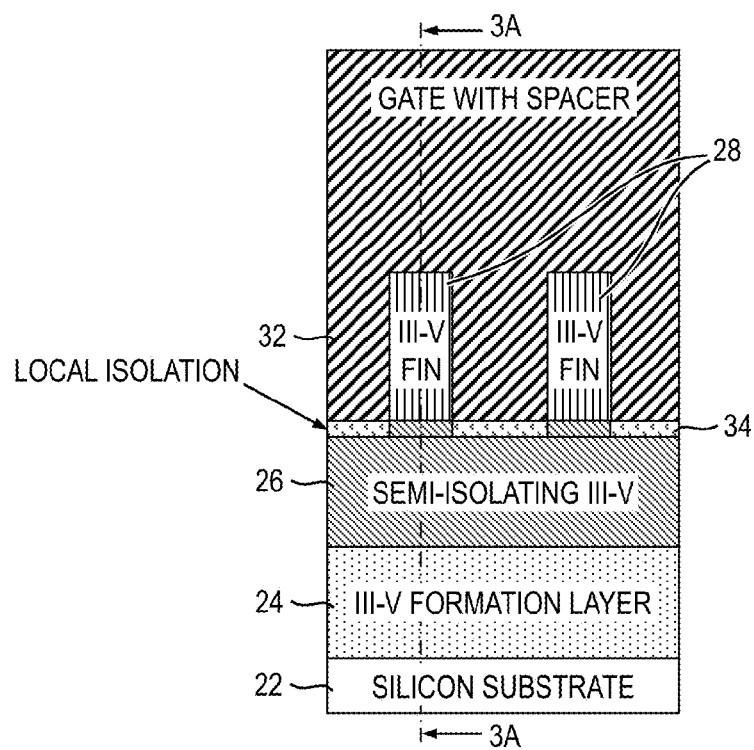
FIG. 3B is a sectional view of the structure shown in FIG. 3A.

Given the discussion thus far, an exemplary method includes obtaining a semiconductor structure including a semiconductor substrate 22 and a plurality of columns 37 extending from the semiconductor substrate, the columns being separated by a plurality of recesses 36. Each of the columns includes a III-V base 24, 26 and a III-V fin structure 28, the III-V fin structure being positioned on the III-V base. FIGS. 3A and 3B show an exemplary semiconductor structure. It will be appreciated that the III-V base may include only layer 24, though use of the semi-isolating layer is advantageous for addressing potential leakage issues. A silicon-containing layer 38, 40 is grown epitaxially on the semiconductor substrate 22 and within the recesses 36 such that a portion of the silicon-containing layer adjoins the III-V fin structures 28. It will be appreciated that the silicon-containing layer can be monolithic or multilayer. For example, the silicon-containing layer in some embodiments is entirely undoped silicon. As discussed above, the formation of p-n junctions beneath the source/drain regions is advantageous, and the formation of such junctions is facilitated by including a p-doped silicon layer 38 when forming the silicon-containing layer. FIGS. 5A and 5B illustrate the exemplary structure 50 obtained following the epitaxial growth of the silicon-containing layer 38, 40. Silicon from the silicon-containing layer is diffused into the III-V fin structures to form n-type junctions 28' as schematically illustrated in FIG. 6A. Source/drain regions 40" as shown in FIG. 8A are formed from the silicon-containing layer. In one or more embodiments of the method, the III-V base of each column 37 includes a semi-isolating III-V layer 26 adjoining one of the III-V fin structures 28. In some embodiments, the step of epitaxially growing the silicon-containing layer includes epitaxially growing a first, p-type silicon layer 38 on the silicon-containing substrate and a second silicon-containing layer 40 on the first, p-type silicon layer. In some embodiments, the p-type silicon layer is grown directly on the semiconductor substrate 22. The n-type source/drain regions 40" are later formed from the second silicon-containing layer 40. The step of forming n-type source/drain regions from the silicon-containing layer includes implanting dopant ions within the second silicon-containing layer, as shown schematically in FIGS. 7A and 7B, and annealing the second silicon-containing layer to recrystallize the second silicon-containing layer following ion implantation to obtain the structure 60 as shown in FIG. 8A. Each column 37 may further includes a gate structure 30 adjoining one of the III-V fin structures 28. The step of obtaining the semiconductor structure may include forming a first III-V layer 24 on the semiconductor substrate, forming a semi-isolating layer 26 of III-V material on the first III-V layer, and forming III-V fin structures 28 on the semi-isolating layer of III-V material. A structure 20 as shown in FIGS. 1A and 1B is thereby obtained. The plurality of recesses 36 are formed through the first III-V layer 24, the semi-isolating layer 26 of III-V material, and the III-V fin structures 28. In some embodiments, a hard mask is formed on the III-V fin structures 28 prior to forming the plurality of recesses 36. The hard mask may include the gate structures 30 on the III-V fin layer and spacers 32 on the gate structures. The method further includes forming local isolation regions 34 on the semi-isolating layer of III-V material in one or more embodiments. As discussed above with respect to the exemplary embodiments, the III-V fin structures 28 can comprise arsenic Annealing the semiconductor structure causes arsenic from the III-V fin structures to be diffused into the silicon-containing layer 40 as well as diffusion of silicon into the III-V fin structures.

An exemplary semiconductor structure includes a semiconductor substrate 22, a plurality of columns 37 extending from the semiconductor substrate 22, the columns being separated by a plurality of recesses 36. Each of the columns includes a III-V base 24, 26 and a III-V fin structure 28, the III-V fin structure comprising arsenic and being positioned on the III-V base. As discussed above, fin structures comprising $In_{0.53}Ga_{0.47}As$ are employed in some embodiments. A silicon-containing layer adjoins the silicon substrate, the silicon-containing layer comprising a plurality of n-type source/drain regions 40". N-type junctions 28' adjoin the source/drain regions. Each of the junctions 28' includes silicon diffused within the III-V fin structures and arsenic diffused within the source/drain regions. In some embodiments, the III-V base of each column 37 includes a semi-isolating III-V layer 26 adjoining one of the III-V fin structures 28. In some embodiments, the silicon-containing layer includes a p-type region 38 adjoining the n-type source/drain regions 40", forming a plurality of p-n junctions 52 therewith. The p-type regions 38 directly contact the semiconductor substrate 22 in some embodiments. Each column 37 can further includes a gate structure 30 adjoining one of the III-V fin structures. Spacers 32 are provided on the gate structures. The semiconductor substrate includes a monocrystalline silicon or silicon germanium layer in one or more embodiments. The semiconductor substrate includes a monocrystalline semiconducting surface portion selected from the group consisting of silicon, silicon germanium, and germanium in some embodiments, the silicon-containing layer directly contacting the surface portion of the semiconductor substrate in exemplary embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above" and "below" are generally employed to indicate relative positions as opposed to relative elevations unless otherwise indicated.

It will be appreciated and should be understood that the exemplary embodiments of the invention described above can be implemented in a number of different fashions. The embodiments were chosen and described in order to best explain the principles of the invention and the practical application, and to enable others of ordinary skill in the art to understand the invention for various embodiments with various modifications as are suited to the particular use contemplated. Those skilled in the art will appreciate that the exemplary structures discussed above can be distributed in raw form or incorporated as parts of intermediate products or end products that benefit from having FinFET devices therein. Given the teachings of the invention provided herein, one of ordinary skill in the related art will be able to contemplate other implementations of the disclosed embodiments.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:
    obtaining a semiconductor structure including a semiconductor substrate and a plurality of columns extending from the semiconductor substrate, the columns being separated by a plurality of recesses, each of the columns including a III-V base and a III-V fin structure, the III-V fin structure being positioned on the III-V base;
    epitaxially growing a silicon-containing layer on the semiconductor substrate and within the recesses such that a portion of the silicon-containing layer adjoins the III-V fin structures, wherein epitaxially growing the silicon-containing layer includes epitaxially growing a first, p-type silicon layer on the semiconductor substrate and a second silicon layer on the first, p-type silicon layer;
    causing diffusion of silicon from the silicon-containing layer into the III-V fin structures to form n-type junctions, and
    forming n-type source/drain regions from the second silicon layer.

2. The method of claim 1, wherein the III-V base of each column includes a semi-isolating III-V layer adjoining one of the III-V fin structures.

3. The method of claim 1, wherein the step of forming n-type source/drain regions from the silicon-containing layer includes implanting dopant ions within the second silicon layer and annealing the second silicon layer to recrystallize the second silicon layer following ion implantation.

4. The method of claim 3, wherein each column further includes a gate structure adjoining one of the III-V fin structures.

5. The method of claim 3, wherein the step of obtaining the semiconductor structure includes:
   obtaining the semiconductor substrate, the semiconductor substrate comprising monocrystalline silicon;
   forming a first III-V layer on the semiconductor substrate;
   forming a semi-isolating layer of III-V material on the first III-V layer;
   forming III-V fin structures on the semi-isolating layer of III-V material, and
   forming the plurality of recesses through the first III-V layer, the semi-isolating layer of III-V material, and the III-V fin structures.

6. The method of claim 5, further including the step of forming a hard mask on the III-V fin structures prior to forming the plurality of recesses.

7. The method of claim 6, wherein the step of forming the hard mask includes forming gate structures on the III-V fin structures and spacers on the gate structures.

8. The method of claim 2, further including forming local isolation regions on the semi-isolating layer of III-V material.

9. The method of claim 1, wherein the III-V fin structures comprise arsenic, and further wherein the step of causing diffusion of silicon from the silicon-containing layer into the III-V fin structures includes annealing the semiconductor structure such that arsenic from the III-V fin structures is diffused into the second silicon layer.

10. The method of claim 5, wherein forming the first III-V layer on the semiconductor substrate further includes growing, in order, gallium arsenide, indium phosphide and indium gallium arsenide on the semiconductor substrate.

11. The method of claim 5, wherein forming III-V fin structures on the semi-isolating layer of III-V material further includes growing a blanket III-V layer onto the semi-isolating layer and then removing selected portions of the blanket layer to obtain the fin structures.

12. The method of claim 11, wherein the semi-isolating layer is formed from InAlAs and the III-V fin structures are formed from $In_{0.53}Ga_{0.47}As$.

13. The method of claim 1, wherein the semiconductor substrate is a silicon substrate.

14. The method of claim 11, wherein the second silicon layer is epitaxially grown as an undoped layer.

* * * * *